(12) United States Patent
Matsuzaki

(10) Patent No.: US 11,518,621 B2
(45) Date of Patent: Dec. 6, 2022

(54) SUBSTRATE WORKING MACHINE

(71) Applicant: FUJI CORPORATION, Chiryu (JP)

(72) Inventor: Naoki Matsuzaki, Nishio (JP)

(73) Assignee: FUJI CORPORATION, Chiryu (JP)

(*) Notice: Subject to any disclaimer, the term of this patent is extended or adjusted under 35 U.S.C. 154(b) by 523 days.

(21) Appl. No.: 16/607,216

(22) PCT Filed: May 9, 2017

(86) PCT No.: PCT/JP2017/017558
§ 371 (c)(1),
(2) Date: Oct. 22, 2019

(87) PCT Pub. No.: WO2018/207260
PCT Pub. Date: Nov. 15, 2018

(65) Prior Publication Data
US 2020/0391955 A1    Dec. 17, 2020

(51) Int. Cl.
H05K 13/08 (2006.01)
B65G 43/00 (2006.01)
H05K 3/34 (2006.01)
H05K 13/00 (2006.01)

(52) U.S. Cl.
CPC ............. B65G 43/00 (2013.01); H05K 3/34 (2013.01); H05K 13/0015 (2013.01); H05K 13/0069 (2013.01); H05K 13/086 (2018.08)

(58) Field of Classification Search
CPC ...... B65G 43/00; H05K 3/34; H05K 13/0015; H05K 13/0069; H05K 13/086; H05K 13/02; Y10T 29/49155; Y10T 29/53048; Y10T 29/53091

USPC ................... 29/846, 709, 721, 742
See application file for complete search history.

(56) References Cited

U.S. PATENT DOCUMENTS

| 6,378,200 B1* | 4/2002 | Lim ..................... H05K 13/085 |
| | | 257/E21.525 |
| 9,422,126 B2* | 8/2016 | Kondo ................. B41F 21/106 |
| 2011/0146508 A1* | 6/2011 | Mizuno ............... H05K 3/1216 |
| | | 101/129 |

(Continued)

FOREIGN PATENT DOCUMENTS

| JP | 2003-17844 A | 1/2003 |
| JP | 2004-359433 A | 12/2004 |

(Continued)

OTHER PUBLICATIONS

International Search Report dated Aug. 8, 2017 in PCT/JP2017/017558 filed on May 9, 2017.

Primary Examiner — Donghai D Nguyen
(74) Attorney, Agent, or Firm — Oblon, McClelland, Maier & Neustadt, L.L.P.

(57) ABSTRACT

A substrate working machine including: a conveyance device configured to convey a substrate; a holding device configured to hold the substrate conveyed to a work position by the conveyance device; and a control device configured to control operation of the conveyance device, wherein the control device is configured to control the operation of the conveyance device such that the substrate is conveyed at a conveyance speed calculated based on a preset setting time and a conveyance distance of the substrate from the work position by the conveyance device or a conveyance distance of the substrate to the work position by the conveyance device.

6 Claims, 12 Drawing Sheets

(56) References Cited

U.S. PATENT DOCUMENTS

2013/0074326 A1 3/2013 Uekawa et al.

FOREIGN PATENT DOCUMENTS

| JP | 2007-160818 A | 6/2007 |
| JP | 2010-147041 A | 7/2010 |

* cited by examiner

SUBSTRATE WORKING MACHINE

TECHNICAL FIELD

The present application relates to a substrate working machine with a conveyance device for conveying a substrate.

BACKGROUND ART

Typically, a substrate working machine is provided with a conveyance device for conveying a substrate, with work being performed on a substrate conveyed by the conveyance device to a work position. An example of this type of substrate working machine is disclosed in the patent literature below.

CITATION LIST

Patent Literature

Patent Literature 1: JP-A-2003-017844

BRIEF SUMMARY

Technical Problem

It is desired to efficiently convey a substrate in a substrate working machine having a conveyance device. The present disclosure takes account of such circumstances and an object thereof is to efficiently convey a substrate.

Solution to Problem

To solve the above problems, disclosed herein is a substrate working machine including: a conveyance device configured to convey a substrate; a holding device configured to hold the substrate conveyed to a work position by the conveyance device; and a control device configured to control operation of the conveyance device, wherein the control device is configured to control the operation of the conveyance device such that the substrate is conveyed at a conveyance speed calculated based on a preset setting time and a conveyance distance of the substrate from the work position by the conveyance device or a conveyance distance of the substrate to the work position by the conveyance device.

Advantageous Effects

According to the present disclosure, the substrate can be conveyed at a conveyance speed in accordance with the conveyance distance of the substrate. As a result, the substrate can be efficiently conveyed.

DESCRIPTION OF EMBODIMENTS

Figure 1:
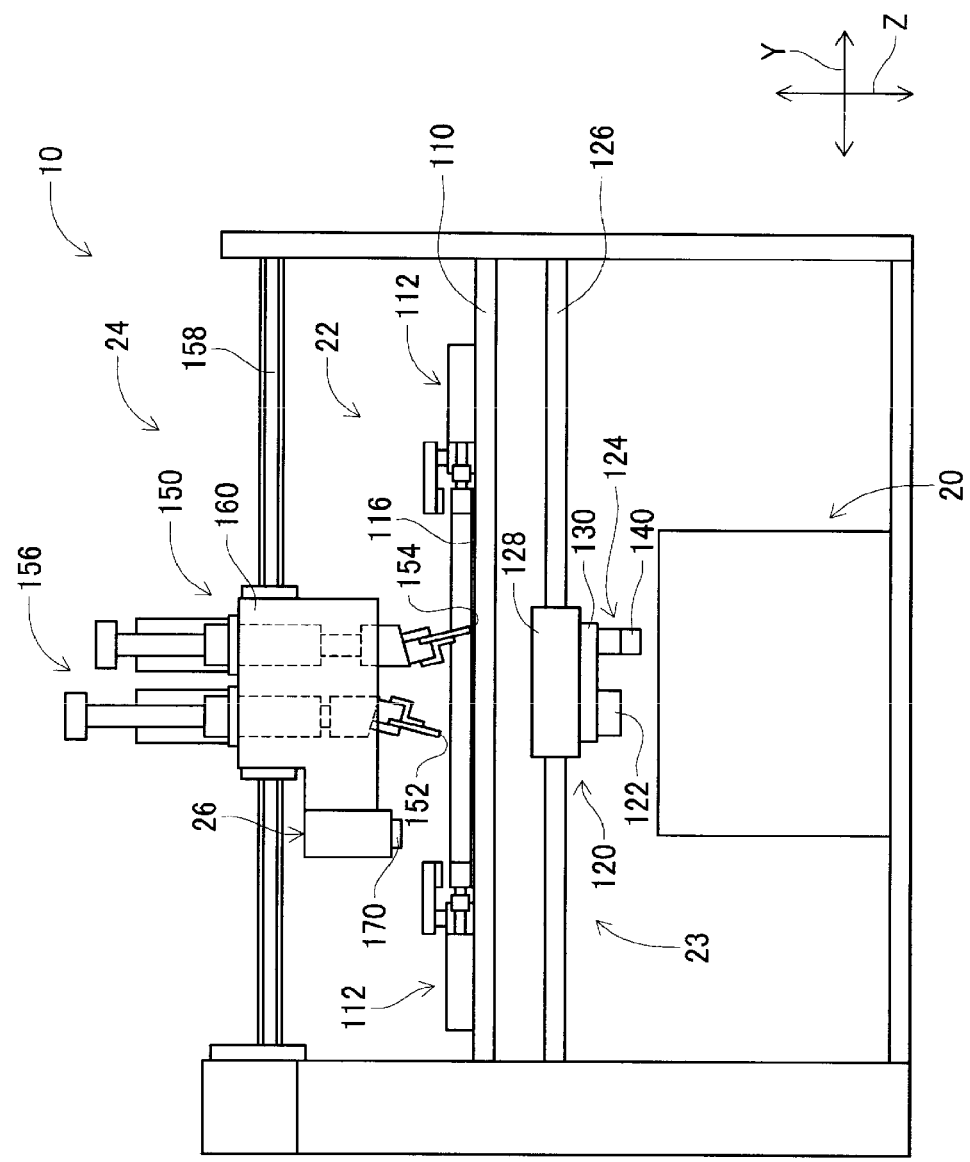
FIG. 1 is a side view showing a solder printer.
Figure 2:
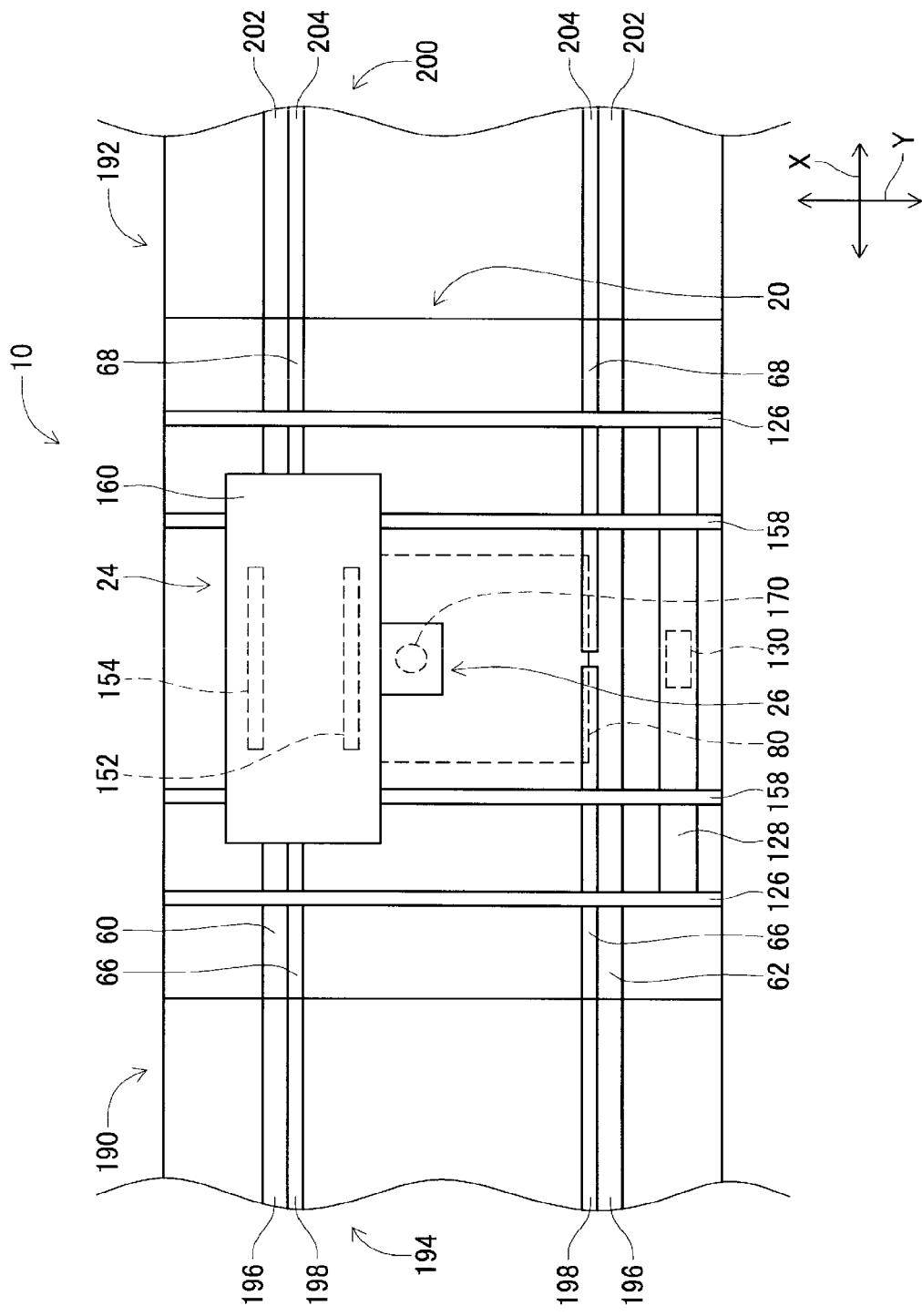
FIG. 2 is a plan view showing the solder printer.

The following describes in detail referring to the figures an example embodiment of the present disclosure.
(A) Solder Printer Configuration FIGS. 1 and 2 show solder printer 10, an embodiment of the present disclosure. Solder printer 10 is a working machine for printing solder paste onto a circuit board. Solder printer 10 includes: board conveying and holding device 20; mask holding device 22; imaging device 23; squeegee device 24; solder supply device 26; and control device 28 (see FIG. 8). FIG. 1 shows solder printer 10 from a side view, and FIG. 2 shows solder printer 10 from above.

Figure 3:
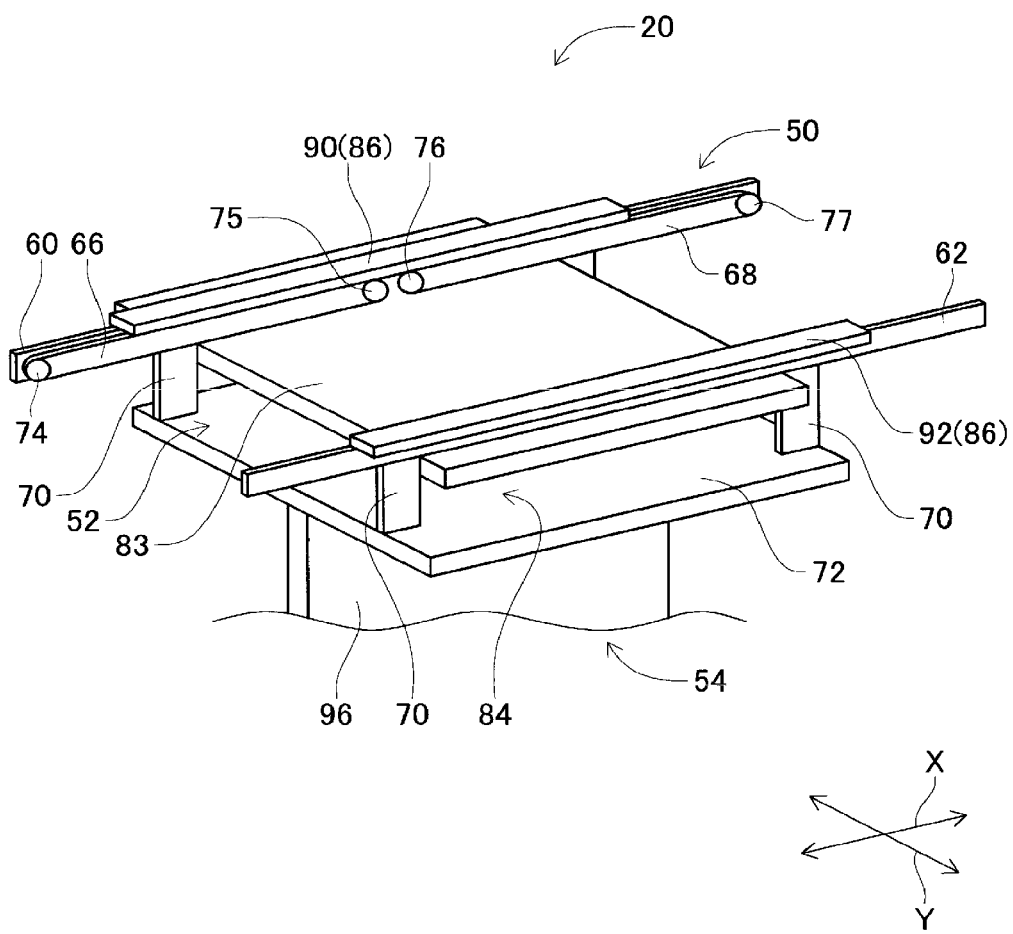
FIG. 3 is a perspective view showing a board conveying and holding device.
Figure 4:
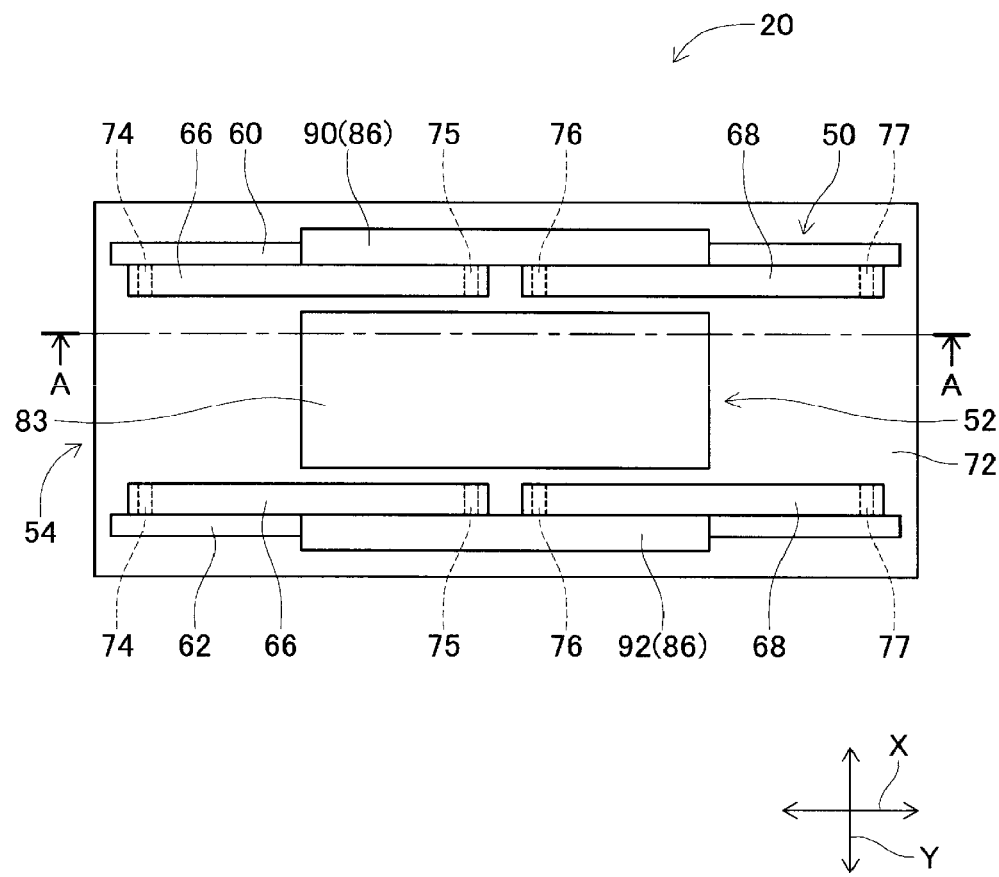
FIG. 4 is a plan view showing the board conveying and holding device.
Figure 5:
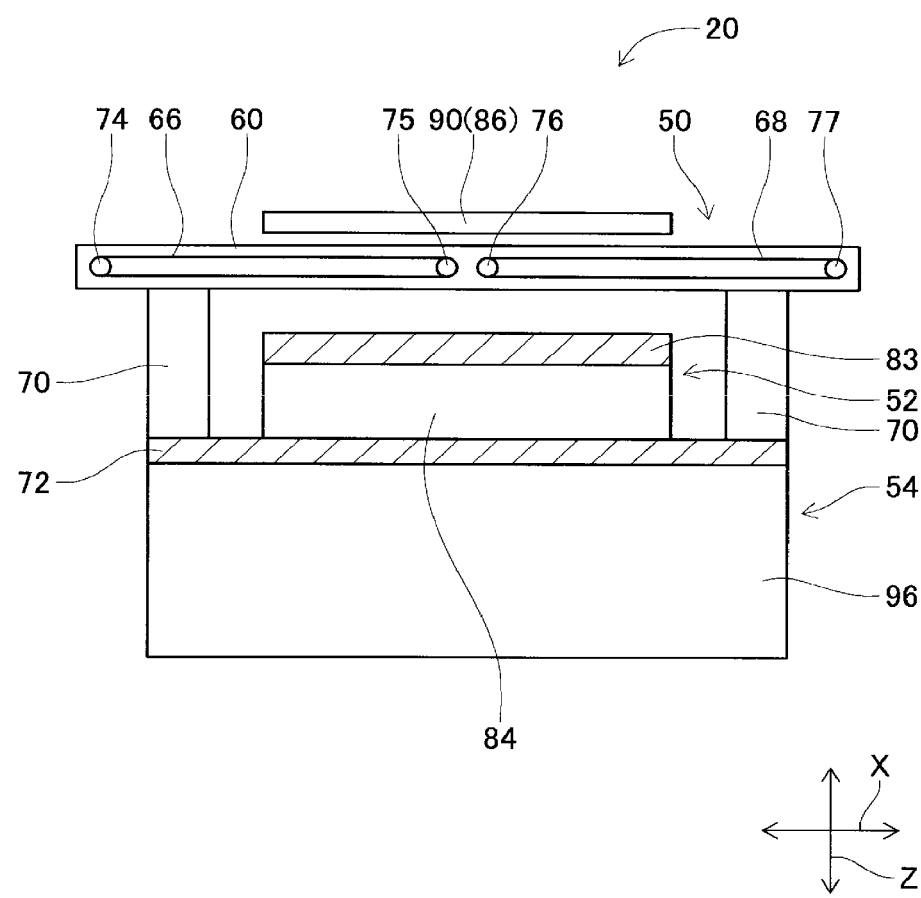
FIG. 5 is a cross section of line AA shown in FIG. 4.

As shown in FIGS. 3 to 5, board conveying and holding device 20 includes conveyor device 50, board holding device 52, and board raising and lowering device 54. FIG. 3 shows board conveying and holding device 20 diagonally from above; FIG. 4 shows board conveying and holding device 20 from above; FIG. 5 shows a view from line AA shown in FIG. 4.

Conveyor device 50 includes pair of guide rails 60 and 62, and first conveyor belt 66 and second conveyor belt 68 provided on guide rails 60 and 62. Pair of guide rails 60 and 62 are arranged parallel to each other, and each guide rail 60 and 62 is supported on an upper surface of raising and lowering table 72 via pair of support legs 70. Note that, the direction in which guide rails 60 and 62 extend is referred to as the X direction, the direction horizontally orthogonal to the X direction is referred to as the Y direction, and the direction orthogonal to both the X direction and the Y direction is referred to as the Z direction.

Four pulleys, 74, 75, 76, 77, are provided on side surfaces of the respective guide rails 60 and 62, with the axis of each pulley being in the Y direction. Out of the four pulleys 74, 75, 76, and 77, two pulleys, that is, pulleys 74 and 77, are arranged at the ends of guide rails 60 and 62, and the other two pulleys, that is, pulleys 75 and 76, are arranged at a central section of guide rails 60 and 62 slightly separated in the X direction. Note that, guide rail 60 and guide rail 62 are arranged such that the flat surfaces of the pulleys 74, 75, 76, and 77 face each other.

Also, first conveyor belts 66 are wound around pulleys 74 and 75 of guide rails 60 and 62, and second conveyor belts 68 are wound around pulleys 76 and 77 of guide rails 60 and 62. First conveyor belt 66 is rotated by the driving of electromagnetic motor 78 (see FIG. 8), and second conveyor belt 68 is rotated by the driving of electromagnetic motor 79 (see FIG. 8). The rotation direction of conveyor belts 66 and 68 is a clockwise direction as shown in FIG. 5.

Figure 6:
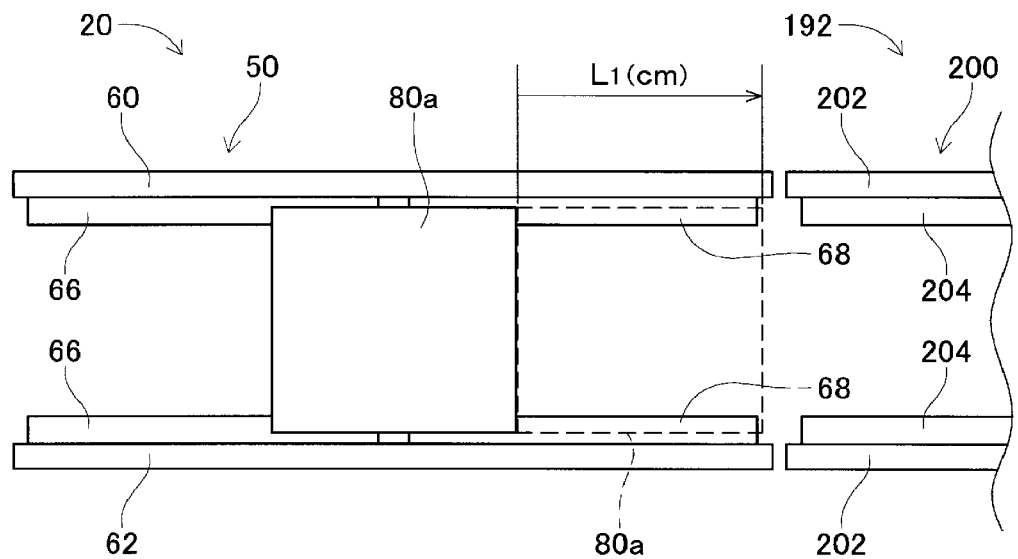
FIG. 6 is an approximate plan view of a conveyor device conveying a circuit board with a large size in the Y direction.

As a result, circuit board 80 is conveyed toward second conveyor belts 68 by being loaded on first conveyor belts 66 (refer to FIG. 6). Therefore, the side on which first conveyor belts 66 are arranged is referred to as an upstream side, and the side on which second conveyor belts 68 are arranged is referred to as a downstream side. The distance between the downstream end of first conveyor belts 66 and the upstream end of second conveyor belts 68 is shorter than the length of the circuit board 80 in the conveying direction. Therefore, circuit board 80 conveyed from first conveyor belts 66 toward second conveyor belts 68 is conveyed toward the second conveyor belt 68 while being supported by both first conveyor belts 66 and second conveyors belt 68, as shown in FIG. 6. Further, circuit board 80 moves from first conveyor belts 66 to second conveyor belts 68 and is conveyed downstream by second conveyor belts 68.

Conveyor device 50 further includes width changing device 81 (refer to FIG. 8) that can change the distance between guide rail 60 and guide rail 62. Specifically, pair of support legs 70 supporting guide rail 62 are slidable in the Y direction. The pair of support legs 70 are moved freely in the Y direction by the driving of electromagnetic motor 82 (refer to FIG. 8). Thus, guide rail 62 supported by pair of support legs 70 is moved towards and away from guide rail 60 while remaining parallel to guide rail 60. This changes the distance between guide rail 60 and guide rail 62. In this manner, the distance between guide rail 60 and guide rail 62 can be changed to convey circuit boards 80 of various Y sizes.

Figure 7:
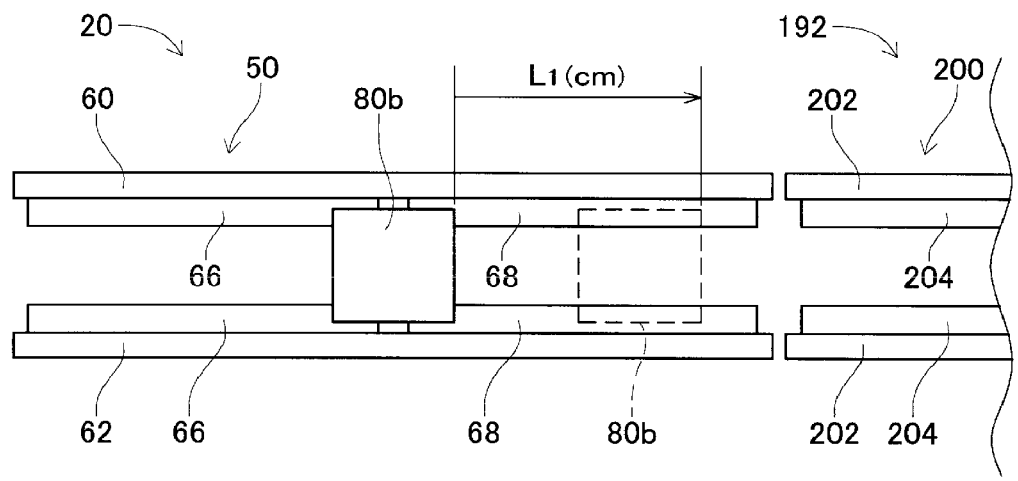
FIG. 7 is an approximate plan view of a conveyor device conveying a circuit board with a small size in the Y direction.

Specifically, for example, as shown in FIG. 6, by increasing the distance between guide rail 60 and guide rail 62 to some extent, circuit board 80*a* having a large dimension in the Y direction can be conveyed. On the other hand, as shown in FIG. 7, by reducing the distance between guide rail 60 and guide rail 62 to some extent, circuit board 80*b* having a small dimension in the Y direction can be conveyed.

Further, as shown in FIGS. 3 to 5, board holding device 52 includes support table 83, table raising and lowering mechanism 84, and clamp device 86. Support table 83 is approximately rectangular and is arranged between the pair of guide rails 60 and 62 extending in the X direction. An upstream end of support table 83 extends to a center section of first conveyor belt 66 in the X direction, and a downstream end of support table 83 extends to a center section of second conveyor belt 68 in the X direction. The ends of support table 83 in the Y direction do not overlap with conveyor belts 66, 68 of guide rails 60, 62 in the Z direction.

Figure 8:
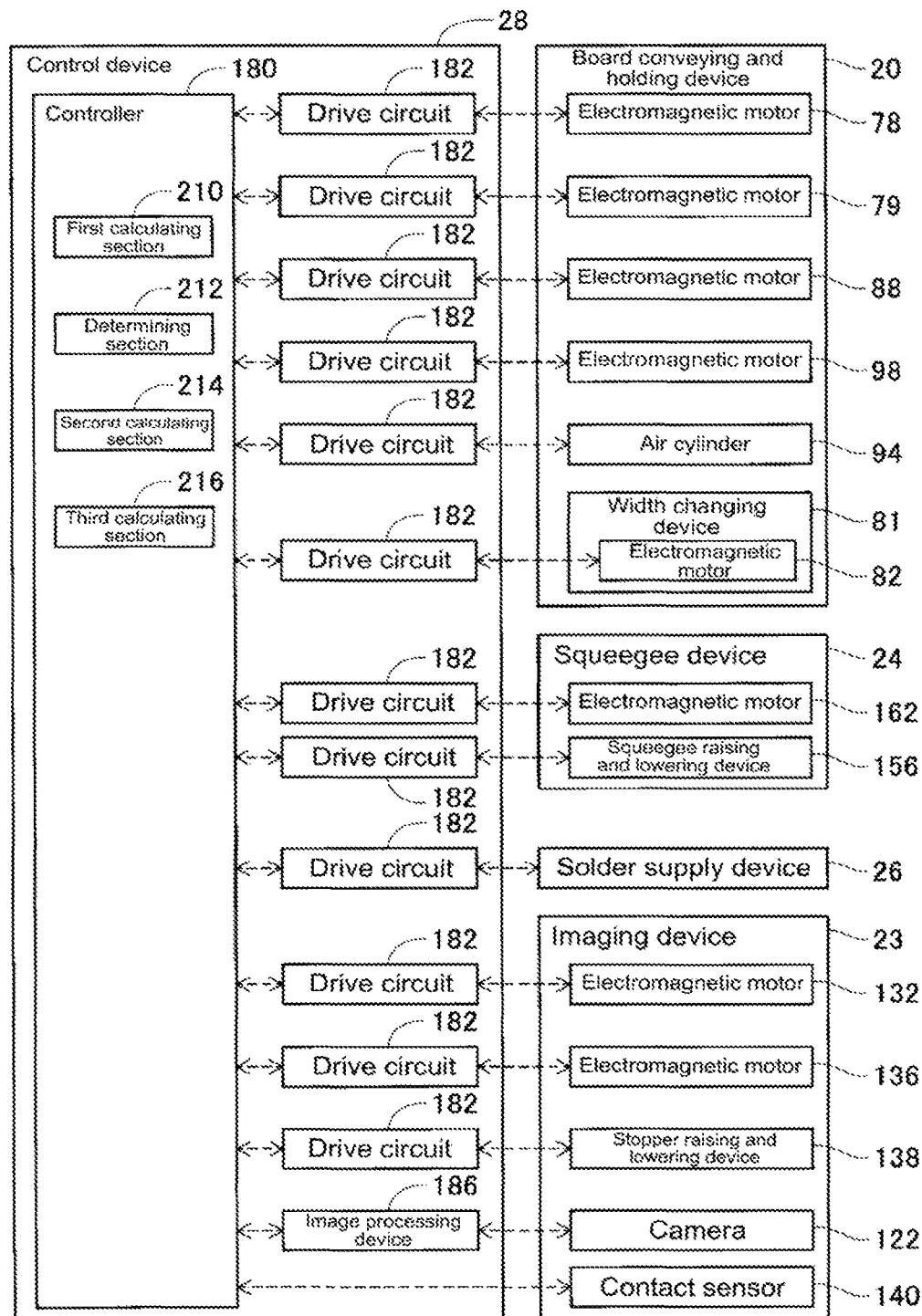
FIG. 8 is a block diagram showing a control device.

Support table 83 is arranged on an upper surface of raising and lowering table 72 via table raising and lowering mechanism 84, and table raising and lowering mechanism 84 raises and lowers support table 83 by the driving of electromagnetic motor 88 (refer to FIG. 8). Note that, support table 83 is raised and lowered by table raising and lowering mechanism 84 between a position where the upper surface of support table 83 is positioned below the upper surfaces of conveyor belts 66 and 68 and a position where the upper surface of support table 83 is positioned several millimeters above the upper surfaces of conveyor belts 66 and 68.

Thus, as shown in FIG. 6, with circuit board 80 conveyed to a position evenly supported by both first conveyor belts 66 and second conveyor belts 68, support table 83 is raised by table raising and lowering mechanism 84 such that circuit board 80 is raised from the upper surfaces of conveyor belts 66 and 68. Note that, a position at which circuit board 80 is uniformly supported by both first conveyor belts 66 and second conveyor belts 68, that is, a position at which the center of circuit board 80 in the X direction and the gap between first conveyor belts 66 and second conveyor belts 68 in the Y direction substantially coincide is referred to as a work position. Further, support table 83 is lowered by table raising and lowering mechanism 84 such that circuit board 80 is loaded on the upper surfaces of conveyor belts 66 and 68.

Also, as shown in FIGS. 3 to 5, clamp device 86 includes fixed clamper 90, movable clamper 92, and air cylinder 94 (see FIG. 8). Fixed clamper 90 and movable clamper 92 are generally rectangular and have a longitudinal dimension substantially the same as the length dimension of support table 83 in the X direction. Fixed clamper 90 is fixed to the upper surface of guide rail 60 so that both ends thereof in the X direction and both ends of the support table 83 in the X direction coincide with each other in the Y direction. On the other hand, movable clamper 92 is arranged on the upper surface of guide rail 62 so that both ends thereof in the X direction and both ends of support table 83 in the X direction coincide with each other in the Y direction. That is, fixed clamper 90 and movable clamper 92 are arranged so as to sandwich support table 83 when viewed from above.

Also, movable clamper 92 is slidable in the Y direction, and is biased by an elastic force of a coil spring (not shown) in a direction away from fixed clamper 90. Movable clamper 92 approaches fixed clamper 90 against the elastic force of the coil spring by the driving of air cylinder 94. The arrangement height of fixed clamper 90 and movable clamper 92 is the same as the height at which circuit board 80 conveyed to the work position is raised from conveyor belts 66, 68 by table raising and lowering mechanism 84. Therefore, when circuit board 80 is raised from conveyor belts 66, 68 by table raising and lowering mechanism 84, movable clamper 92 is made to approach fixed clamper 90 by air cylinder 94, whereby circuit board 80 is clamped by fixed clamper 90 and movable clamper 92. Thus, circuit board 80 is clamped by clamp device 86 in a state raised from conveyor belts 66, 68.

Further, board raising and lowering device 54 includes raising and lowering table 72 and table raising and lowering mechanism 96. Table raising and lowering mechanism 96 raises and lowers raising and lowering table 72 by the driving of electromagnetic motor 98 (see FIG. 8). As a result, conveyor device 50 and board holding device 52 arranged on raising and lowering table 72 are raised and lowered by board raising and lowering device 54. That is, circuit board 80 clamped by clamp device 86 is raised and lowered by board raising and lowering device 54.

As shown in FIG. 1, mask holding device 22 includes mask support table 110 arranged above board conveying and holding device 20, and mask fixing mechanism 112 arranged on the upper surface of mask support table 110. An opening section (not shown) is formed at a center section of mask support table 110, and mask 116 is placed on the stencil support table 110 so as to cover the opening section. Mask 116 mounted on mask support table 110 is fixedly held by mask fixing mechanism 112.

The opening section formed on mask support table 110 is larger than circuit board 80 conveyed by board conveying and holding device 20. Further, circuit board 80 clamped by clamp device 86 is raised by board raising and lowering device 54 so as to come into close contact with the lower surface of mask 116 held by mask fixing mechanism 112. Also, circuit board 80 clamped by clamp device 86 is lowered by board raising and lowering device 54 so as to move away from the lower surface of mask 116.

As shown in FIGS. 1 and 2, imaging device 23 includes camera moving device 120, camera 122, and stopper 124. Camera moving device 120 includes pair of slide rails 126, Y slider 128, and X slider 130. Pair of slide rails 126 are arranged between board conveying and holding device 20 and mask holding device 22 so as to extend parallel to each other and in the Y-axis direction. Y slider 128 is slidably held by pair of slide rails 126, and slides in the Y direction by operation of electromagnetic motor 132 (see FIG. 8). X slider 130 is slidably attached to a lower surface of Y slider 128 in the X direction, and slides in the X direction by operation of electromagnetic motor 136 (see FIG. 8). Note that, slide rails 126 do not overlap board raising and lowering device 54 of board conveying and holding device 20 in the vertical direction, and Y slider 128 moves from above board raising and lowering device 54, such that circuit board 80 is lifted by board raising and lowering device 54 without contacting imaging device 23.

Camera 122 is attached to a lower surface of X slider 130 so as to face downward. Stopper 124 is generally rod-shaped and is attached to the underside of X slider 130 extending downward. As a result, camera 122 and stopper 124 can be moved to any position above board conveying and holding device 20. Note that, stopper 124 includes stopper raising and lowering device 138 (see FIG. 8) and can be lowered from X slider 130 or raised toward X slider 130. Further, contact sensor 140 is arranged at the leading end of stopper 124, and contact of another member to the leading end of stopper 124 is detected by contact sensor 140.

Squeegee device 24 includes squeegee moving device 150, pair of squeegees 152 and 154, and squeegee raising and lowering device 156. Squeegee moving device 150 includes pair of slide rails 158 and slider 160. Pair of slide rails 158 are arranged above mask holding device 22 so as to extend parallel to each other in the Y axis direction. Slider 160 is slidably mounted on pair of slide rail 158, and slides in the Y direction by operation of electromagnetic motor 162 (refer to FIG. 8). Each of the pair of squeegees 152 and 154 is substantially rectangular and made from a flexible material. The pair of squeegees 152 and 154 are arranged facing each other and extending in the X-axis direction, and are held below slider 160 by squeegee raising and lowering device 156. Squeegee raising and lowering device 156 individually raises and lowers the pair of squeegees 152 and 154.

Solder supply device 26 is for supplying solder paste and discharge opening 170 for discharging solder paste is formed on a lower surface of solder supply device 26. Solder supply device 26 is fixed to a side surface of slider 160 at a central portion in the Y-axis direction. Therefore, solder supply device 26 can be moved to a given position in the Y-axis direction by operation of squeegee moving device 150.

As shown in FIG. 8, control device 28 includes controller 180, multiple drive circuits 182, and image processing device 186. The multiple drive circuits 182 are connected to the above-mentioned electromagnetic motors 78, 79, 82, 88, 98, 132, 136, and 162, air cylinder 94, stopper raising and lowering device 138, squeegee raising and lowering device 156, and solder supply device 26. Controller 80 is provided with a CPU, ROM, RAM, and so on, is formed mainly from a computer, and is connected to the multiple drive circuits 182. As a result, the operation of board conveying and holding device 20, squeegee device 24, and the like is controlled by controller 180. Controller 180 is also connected to image processing device 186. Image processing device 186 processes image data obtained by camera 122, and controller 180 acquires various types of information from the image data. Further, controller 180 is connected to contact sensor 140, and obtains detection values from contact sensor 140.

As shown in FIG. 2, solder printer 10 is arranged between two working machines 190 and 192. Working machine 190 is arranged on the upstream side of solder printer 10, and working machine 192 is arranged on the downstream side of solder printer 10. Working machine 190 includes conveyance device 194 for conveying circuit board 80, and conveyance device 194 includes pair of guide rails 196. Pair of guide rails 196 are arranged parallel extending in the X direction. Conveyor belts 198 are rotatably attached to the sides of each guide rail 196 facing each other, and are rotated in the same direction as the conveyor belts 66, 68 by the driving of an electromagnet motor (not shown).

Working machine 192 also includes conveyance device 200 for conveying circuit board 80. Conveyance device 200 includes pair of guide rails 202 and pair of conveyor belts 204, and conveyance device 200 has the same construction as conveyance device 194, so will not be described here. Conveyor belts 198 of working machine 190, conveyor belts 66, 68 of solder printer 10, and conveyor belts 204 of working machine 192 are arranged on a straight line in the X-direction.

As a result, circuit board 80 unloaded from working machine 190 is loaded into solder printer 10, and circuit board 80 unloaded from solder printer 10 is loaded into working machine 192. That is, circuit board 80 can be conveyed in the order of working machine 190, solder printer 10, and working machine 192. Note that, working machines 190 and 192 also have a width changing device (not shown) of the same construction as width changing device 81 of solder printer 10, and the distance between the pair of conveyor belts 198 and 204 can be freely changed. Thus, circuit boards 80 of various sizes in the Y direction can be conveyed in the order of working machine 190, solder printer 10, and working machine 192.

(B) Operation of the Solder Printer

With solder printer 10, according to the above-described configuration, circuit board 80 is conveyed to the work position and clamped by clamp device 86. The clamped circuit board 80 is then raised by board raising and lowering device 54 so that it is in close contact with the underside of mask 116. Through-holes (not shown) are formed in mask 116 in accordance with the pattern of the pads and the like of circuit board 80. Solder paste is applied onto mask 116 and printed onto circuit board 80 via the through-holes of mask 116.

More specifically, in working machine 190, circuit board 80 conveyed by conveyance device 194 is unloaded from the downstream end of conveyor belts 198 of conveyance device 194. As a result, the unloaded circuit board 80 is loaded into solder printer 10, and is conveyed downstream by first conveyor belts 66 in solder printer 10. The downstream end of circuit board 80 is then loaded on the upstream end of second conveyor belts 68. Here, circuit board 80 is conveyed toward the downstream side while being supported by both first conveyor belts 66 and second conveyor belts 68.

Further, before circuit board 80 is conveyed to second conveyor belts 68, with imaging device 23, X slider 130 is moved upward between pair of second conveyor belts 68 by camera moving device 120 and stopper 124 attached to X slider 130 is lowered. Here, stopper 124 is lowered until its tip is positioned below the upper surface of second conveyor belts 68.

This causes circuit board 80 conveyed by both first conveyor belts 66 and second conveyor belts 68 to contact the leading end of stopper 124, by which contact sensor 140 sends a detection signal to controller 180. When controller 180 receives the detection signal from contact sensor 140, operation of first conveyor belts 66 and second conveyor belts 68 is stopped at the position where circuit board 80 contacted stopper 124. Note that, the lowered position of stopper 124 is a position where the downstream end in the X direction of circuit board 80 is located when the center of the circuit board 80 in the X direction substantially coincides with the gap between first conveyor belts 66 and second conveyor belts 68 in the Y direction, and the circuit board 80 contacting stopper 124 at this position is stopped at the work position. In other words, circuit board 80 conveyed by both first conveyor belts 66 and second conveyor belts 68 is kept at the work position by stopper 124, and the circuit board 80 is stopped at the work position by stopping the operation of both first conveyor belts 66 and second conveyor belts 68 by contact with stopper 124.

When circuit board 80 stops at the work position, stopper 124 rises. Subsequently, with board conveying and holding device 20, support table 83 is raised and the circuit board 80 is lifted from conveyor belts 66, 68 and clamped by clamp device 86. Then, when circuit board 80 has been clamped by clamp device 86, circuit board 80 clamped by clamp device 86 is imaged by camera 122 attached to X slider 130. The stopping position of circuit board 80, the type of the circuit board 80, and the like are analyzed by controller 180 based on the image data. Thereafter, raising and lowering table 72 is raised by board raising and lowering device 54. As a result, the circuit board 80 clamped by clamp device 86 is raised together with conveyor device 50 and comes into close contact with the lower surface of mask 116.

Next, solder paste is supplied to the upper surface of mask 116 by solder supply device 26. Then, one of the pair of squeegees 152 and 154 is lowered by squeegee raising and lowering device 156, and the lower end of the squeegee contacts the upper surface of mask 116. The solder paste is spread by the squeegee by the squeegee being moved by squeegee moving device 150 in the Y direction. Here, solder paste fills the through-holes of mask 116 and is printed onto the circuit board 80. This completes printing operation to the circuit board 80.

Subsequently, when printing operation on the circuit board 80 is complete, raising and lowering table 72 is lowered, and the circuit board 80 is lowered together with raising and lowering table 72, whereby the close contact to the lower surface of mask 116 is released. Further, during the lowering of raising and lowering table 72, or when the lowering of raising and lowering table 72 is started, the clamping of the circuit board 80 by clamp device 86 is released, and support table 83 is lowered. This causes the unclamped circuit board 80 to be lowered toward first conveyor belts 66 and second conveyor belts 68.

Also, while raising and lowering table 72 and support table 83 are being lowered, operation of both conveyor belts 66 and 68 of first conveyor belts 66 and second conveyor belts 68 is started. That is, with conveyance device 50 for which the lowering of raising and lowering table 72 lowers conveyor device 50, first conveyor belts 66 and second conveyor belts 68 start to operate while the circuit board is being lowered toward first conveyor belts 66 and second conveyor belts 68 by the lowering of support table 83. Therefore, the circuit board 80 supported by support table 83 is loaded on first conveyor belts 66 and second conveyor belts 68 and is conveyed toward the downstream side while conveyor device 50 is being lowered.

Subsequently, as the circuit board 80 is conveyed from the work position to the downstream side, the circuit board 80 moves from first conveyor belts 66 to second conveyor belts 68. Then, the circuit board 80 is conveyed further downstream to be unloaded from the downstream end of second conveyor belts 68. As a result, the circuit board 80 is loaded into working machine 192, and is conveyed downstream inside working machine 192 by conveyance device 200 of working machine 192.

(C) Changing the Conveyance Speed According to the Size of the Circuit Board in the X-Direction As described above, with solder printer 10, circuit board 80 held by clamp device 86 is raised from the conveyance position of the circuit board 80 together with conveyor device 50, and printing operation is performed in the raised position. After printing operation on circuit board 80 is completed, conveyor device 50 is lowered, and while conveyor device 50 is being lowered, the circuit board 80 is conveyed downstream. This makes it possible to shorten the cycle time. Here, by changing the conveyance speed of circuit board 80 in accordance with the size of the circuit board in the X-direction, the cycle time can be further shortened.

Figure 9:
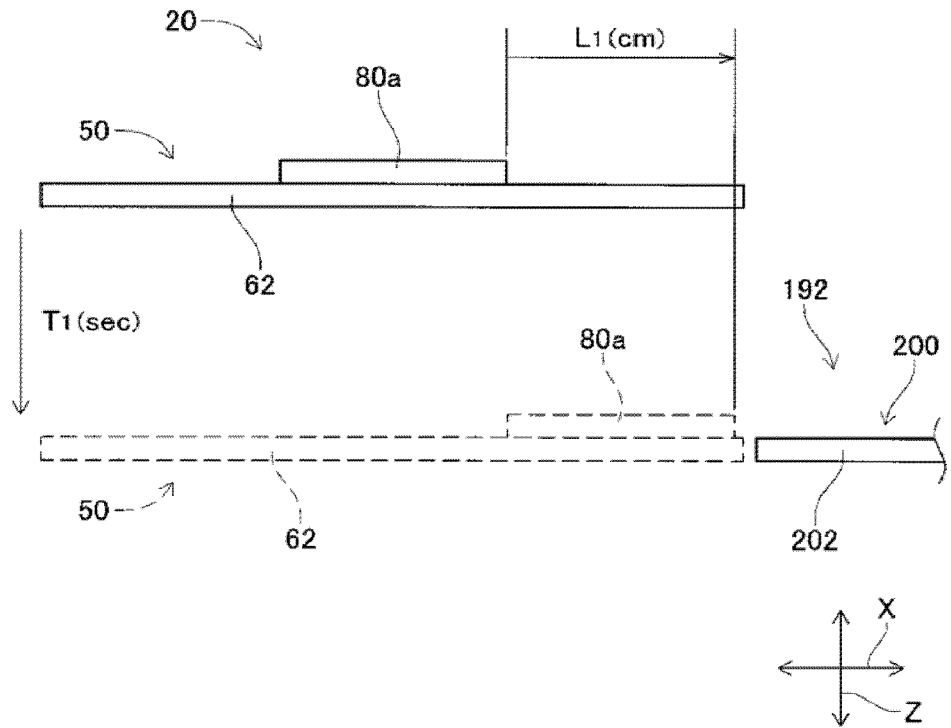
FIG. 9 is an approximate side view of a conveyor device conveying a circuit board with a large size in the X direction.

More specifically, as shown in FIGS. 6 and 9, the conveyance distance when the circuit board 80*a* large in the X direction is conveyed from the work position (the position indicated by the solid line of circuit board 80*a*) to the position on the most downstream side of conveyor device 50 (hereinafter, referred to as the "most downstream position") (the position indicated by the dotted line of the circuit board 80*a*) is L1 (cm). Further, time required for conveyor device 50 to be lowered by board raising and lowering device 54 after circuit board 80*a* is loaded on conveyor belts 66, 68 after printing operation has been performed (hereinafter referred to as "device lowering time") is denoted by $T_1$ (sec).

In this manner, when the conveyance distance is $L_1$ (cm) and the device lowering time is T1 (sec), the conveyance speed of circuit board 80*a* is $L_1/T_1$(cm/sec), at which speed circuit board 80*a*, which is large in the X direction, is conveyed from the work position to the most downstream position. That is, while conveyor device 50 is being lowered, circuit board 80*a* is conveyed to a position just before being unloaded from solder printer 10. As a result, to the maximum extent possible, circuit board 80*a* is conveyed downstream during the time while conveyor device 50 is being lowered. Then, circuit board 80*a* conveyed to the position immediately before being conveyed out of solder printer 10, that is, the most downstream position, is conveyed into working machine 192 at the same speed, that is, conveyance speed $L_1/T_1$(cm/sec). This makes it possible to shorten the cycle time.

Figure 10:
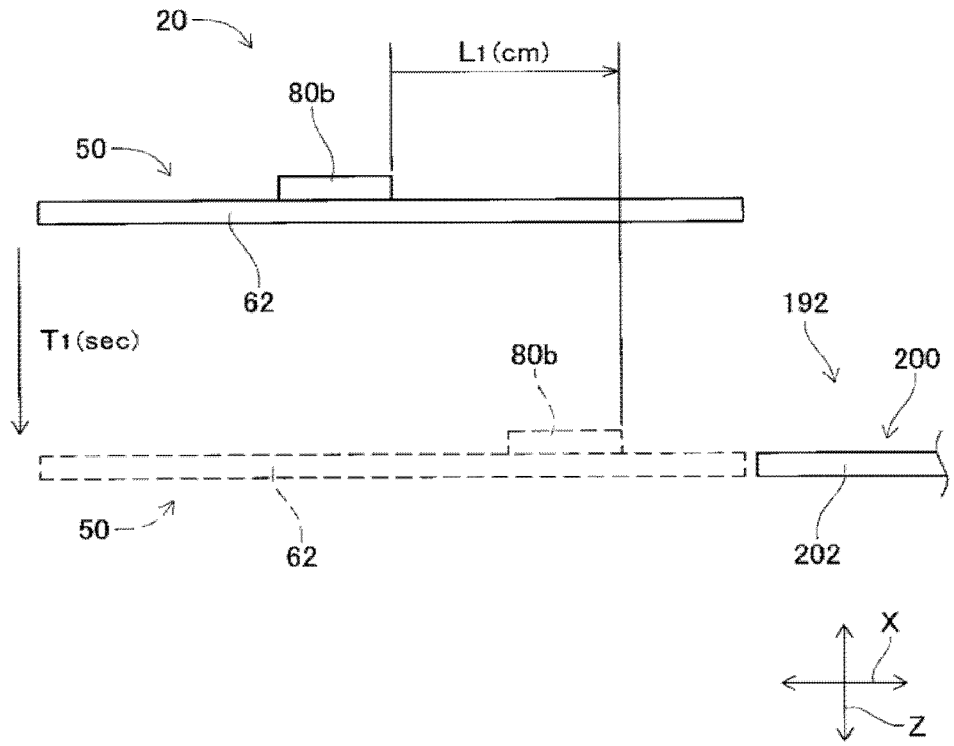
FIG. 10 is an approximate side view of a conveyor device conveying a circuit board with a small size in the X direction.

Next, consider a case in which circuit board 80*b* having a small size in the X direction is conveyed at the same speed as conveyance speed $L_1/T_1$ (cm/sec) of the circuit board 80*a* having a large size in the X direction. In such cases, the size circuit board 80*b* that is small in the X direction is transported $L_1$ (cm) from the work position while conveyor device 50 is being lowered, as shown in FIGS. 7 and 10. Here, the circuit board 80*b* is not conveyed to the position immediately before being unloaded from solder printer 10, that is, to the most downstream position. This is because the downstream end of the circuit board 80b at the work position is located upstream of the downstream end of the circuit board 80a at the work position. That is, the conveyance distance from the work position of circuit board 80b to the most downstream position is longer than the conveyance distance from the work position of circuit board 80a to the most downstream position.

In this manner, if circuit board 80b is not conveyed to the most downstream position while the conveyor device 50 is being lowered, the circuit board 80b cannot be conveyed downstream to the maximum extent possible during the time while conveyor device 50 is being lowered, resulting in wasted time. Specifically, the time for conveying the circuit board 80b to the most downstream position after the conveyor device 50 has been lowered becomes wasted time.

Figure 11:
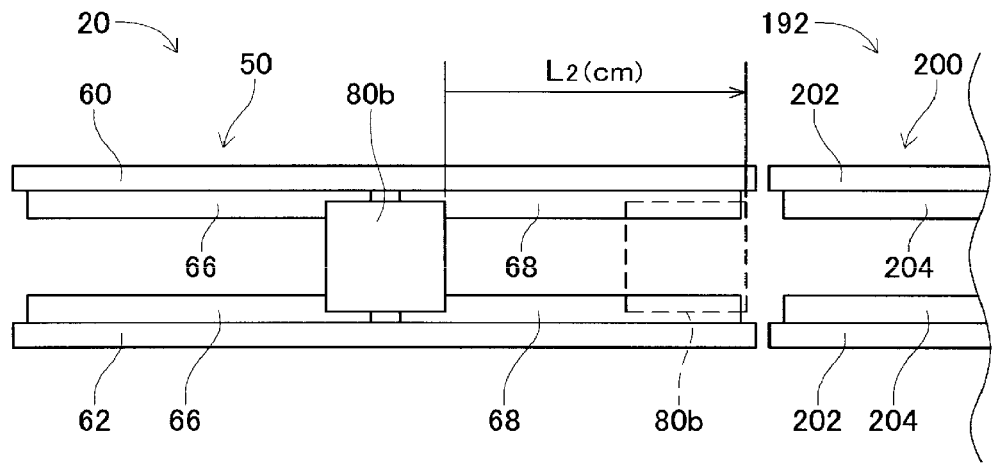
FIG. 11 is an approximate plan view of a conveyor device conveying a circuit board with a small size in the X direction.
Figure 12:
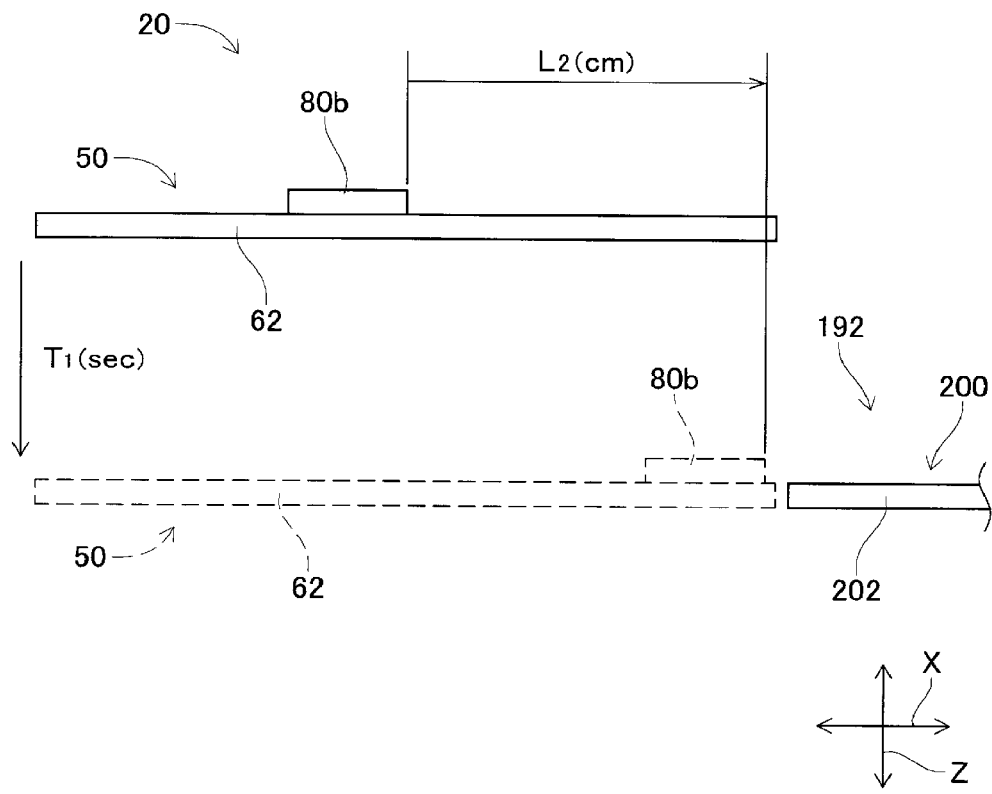
FIG. 12 is an approximate side view of a conveyor device conveying a circuit board with a small size in the X direction.

Thus, in order to convey circuit board 80b that is small in the X direction from the work position to the most downstream position while the conveyor device 50 is being lowered, the conveyance speed of circuit board 80b is calculated based on the conveyance distances of circuit board 80b and the device lowering time. Specifically, as shown in FIGS. 11 and 12, the circuit board 80b that is small in the X direction is conveyed $L_2$ ($>L_1$) (cm) when it is conveyed from the work position (the position indicated by the solid line of circuit board 80b) to the most downstream position (the position indicated by the dotted line of circuit board 80b). In addition, the device lowering time is the same as the lowering time for board 80a that is large in the X-direction, that is, $T_1$ (sec).

In such a case, with the conveyance speed of circuit board 80b set to $L_2/T_1$(cm/sec), the circuit board 80b that is small in the X-direction is conveyed from the work position to the most downstream position. That is, while conveyor device 50 is being lowered, the circuit board 80b is conveyed to a position just before being unloaded from solder printer 10. As a result, to the maximum extent possible, circuit board 80b is conveyed downstream during the time while conveyor device 50 is being lowered, such that the cycle time is shortened.

In other words, with solder printer 10, the conveyance speed of circuit board 80a having a large size in the X direction when the conveyor device 50 is being lowered is $L_1/T_1$ (cm/sec), and the conveyance speed of circuit board 80b having a small size in the X direction when conveyor device 50 is being lowered is $L_2/T_1$ (cm/sec). In this manner, by changing the conveyance speed in accordance with the size of the circuit board in the X direction, the circuit board 80 can be conveyed downstream to the maximum extent possible during the time while conveyor device 50 is being lowered, such that the cycle time is shortened.

Note that, controller 180 of control device 28 memorizes: information related to the work position and the most downstream position corresponding to the size of the circuit board 80 in the X direction; and information related to the size of the circuit board 80 in the X direction and the Y direction. Therefore, in controller 180, conveyance distances $L_1$ and $L_2$ are calculated based on these various pieces of information. Also, controller 180 memorizes device lowering time $T_1$. Thereby, in controller 180, the conveyance speed corresponding to X-direction size of circuit board 80 is calculated.

Further, working machine 192 is provided with a detection sensor (not shown), and whether there is a circuit board on conveyance device 200 of working machine 192 is detected by the detection sensor. The detection sensor is connected to controller 180, and the detection results of the detection sensor are received by controller 180. Controller 180 determines whether circuit board 80 can be loaded into working machine 192 based on the detection result of the detection sensor.

In detail, when a detection result indicating that there is a circuit board in conveyance device 200 of working machine 192 is received by controller 180 from the detection sensor, it is determined that a circuit board cannot be loaded into working machine 192. On the other hand, when a detection result indicating that there is not a circuit board in conveyance device 200 of working machine 192 is received by controller 180 from the detection sensor, it is determined that a circuit board can be loaded into working machine 192. The timing at which it is determined whether a circuit board can be loaded into working machine 192 is the timing at which printing operation has been completed, or the timing at which the circuit board is separated from mask 116. That is, it is the timing at which printing of solder paste by squeegee device 24 has been completed, or the timing at which lowering has started of at least one of raising and lowering table 72 and support table 83.

When it is determined that a circuit board can be loaded into working machine 192, circuit board 80 is conveyed at the calculated conveyance speed while conveyor device 50 is being lowered and is loaded into working machine 192 while maintaining that conveyance speed. That is, operation of conveyor device 50 is controlled such that the circuit board 80 is conveyed at the calculated conveyance speed while conveyor device 50 is being lowered and after the lowering of conveyor device 50 has been completed.

On the other hand, when it is determined that a circuit board cannot be loaded into working machine 192, circuit board 80 is conveyed at the calculated conveyance speed while conveyor device 50 is being lowered and is then decelerated at a specified time. Then, circuit board 80 is stopped before being loaded into working machine 192. That is, while conveyor device 50 is being lowered, operation of conveyor device 50 is controlled such that circuit board 80 is conveyed at the calculated conveyance speed, decelerated at a specified time, and stopped before the circuit board 80 passes through the most downstream position.

Note that, when it is determined that a circuit board cannot be loaded into working machine 192, the timing at which to reduce the conveyance speed of the circuit board is calculated based on the information related to the circuit board and the information related to second conveyor belts 68. In detail, controller 180 memorizes the weight of the circuit board, the coefficient of friction, the dimensions in the X direction and the Y direction, and the like as information related to the circuit board, and memorizes the coefficient of friction and the like of second conveyor belts 68 as information related to second conveyor belts 68. Then, the controller 180 calculates deceleration timing such that the circuit board being conveyed at the calculated conveyance speed can be stopped before passing through the most downstream position, based on the information related to the circuit board and the information related to second conveyor belts 68. As a result, even if the circuit board is made of a slippery material, the circuit board is prevented from going past the most downstream position, and the circuit board is appropriately stopped inside solder printer 10.

Further, with solder printer 10, not only while conveyor device 50 is being lowered, but also while the circuit board is conveyed from working machine 190 to solder printer 10 and conveyed to the work position, the conveyance speed of the circuit board is changed in accordance with the size of the circuit board in the X direction. Specifically, with solder printer 10, as mentioned above, when the circuit board 80 is stopped at the work position, Y slider 128 of imaging device 23 moves upward between the pair of second conveyor belts 68, and stopper 124 on that Y slider 128 is lowered. This causes the circuit board conveyed by conveyor belts 66, 68 to contact stopper 124 and the circuit board to be stopped at the work position.

In this manner, with solder printer 10, circuit board 80 is stopped at the work position by contacting stopper 124. With a conventional method, after stopper 124 is moved to a position where the circuit board can be stopped at the work position (hereinafter, referred to as "stopper stopping position"), the circuit board is loaded into solder printer 10 and is conveyed by conveyor device 50. However, with such an approach, the circuit board cannot be conveyed while stopper 124 is being moved to the stopper stopping position, and a time loss occurs.

In view of this, the circuit board is loaded into solder printer 10 and conveyed by conveyor device 50 before stopper 124 is moved to the stopper stopping position, taking into account the time to move stopper 124 to the stopper stopping position (hereinafter referred to as the "stopper movement time"). More specifically, time $T_2$ required until the circuit board is loaded into solder printer 10 and then conveyed to the work position by conveyor device 50 (hereinafter, referred to as "conveyance time during loading") is set based on the stopper movement time. For example, when the timing of loading the circuit board into solder printer 10 and the timing of starting the movement of stopper 124 are the same, loading time $T_2$ is set to a time slightly longer than the stopper movement time.

In this manner, by setting conveyance time during loading to $T_2$, the circuit board conveyance speed is calculated based on the conveyance distance from when the circuit board is loaded into solder printer 10 to when the circuit board is conveyed to the work position by conveyor device 50, and the set conveyance time during loading $T_2$. Then, by conveying the circuit board to the work position at the conveyance speed, stopper 124 can be moved and the circuit board can be conveyed to the work position in parallel, and the time loss is prevented from occurring.

Figure 13:
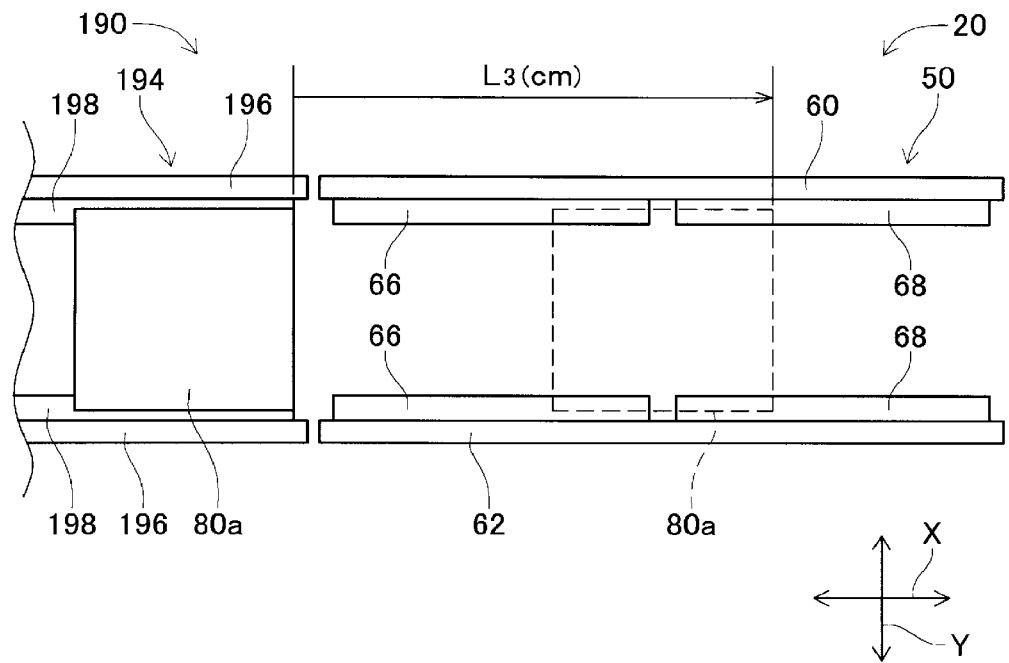
FIG. 13 is an approximate plan view of a conveyor device conveying a circuit board with a large size in the X direction.

However, the conveyance distance from when the circuit board is loaded into solder printer 10 to when the circuit board is conveyed to the work position by the conveyor device 50 depends on the size of the circuit board in the X direction. Specifically, as shown in FIG. 13, the conveyance distance of the circuit board 80a having a large size in the X direction from the position immediately before being conveyed into solder printer 10 (the position where circuit board 80a is indicated by the solid line) to the work position (the position where circuit board 80a is indicated by the dotted line), is $L_3$ (cm). Note that, the position immediately before being loaded into solder printer 10, that is, the most downstream position of conveyor device 50 of conveyance device 194 of working machine 190, is referred to as the most downstream position.

Figure 14:
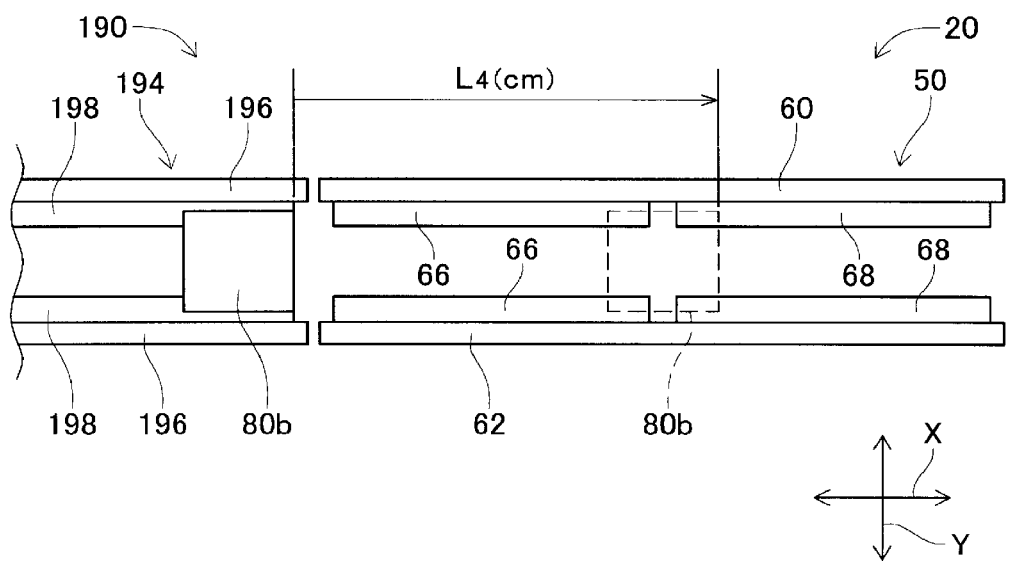
FIG. 14 is an approximate plan view of a conveyor device conveying a circuit board with a small size in the X direction.

On the other hand, as shown in FIG. 14, the conveyance distance of circuit board 80b having a small size in the X direction from the most downstream position of working machine 190 (the position where circuit board 80b is indicated by the solid line) to the work position (the position where circuit board 80b is indicated by the dotted line) is $L_4$ (cm), which is shorter than the conveyance distance of the circuit board 80a having a large size in the X direction. This is because the downstream end of the circuit board 80b at the work position is located upstream of the downstream end of the circuit board 80a at the work position. Thus, the conveyance speed of circuit board 80a having a large size in the X direction is calculated as $L_3/T_2$(cm/sec), and the conveyance speed of circuit board 80b having a small size in the X direction is calculated as $L_4/T_2$(cm/sec). The circuit board is loaded into solder printer 10 and conveyed to the work position at the calculated conveyance speed, movement of stopper 124 and conveyance of the circuit board to the work position are performed in parallel, and the circuit board is appropriately stopped at the work position by stopper 124.

Note that, controller 180 of control device 28 memorizes: information related to the work position corresponding to the size of the circuit board 80 in the X direction; information related to the most downstream position of working machine 190 corresponding to the size of the circuit board 80 in the X direction; and information related to the size of the circuit board 80 in the X direction and the Y direction. Therefore, in controller 180, conveyance distances $L_3$ and $L_4$ are calculated based on these various pieces of information. The controller 180 also memorizes conveyance time during loading $T_2$. As a result, in controller 180, the loading speed at the time of loading of the circuit board corresponding to the X-direction size of the circuit board 80 is calculated.

Further, as shown in FIG. 8, controller 180 includes first calculating section 210, determining section 212, second calculating section 214, and third calculating section 216. First calculating section 210 is a functional unit for calculating the conveyance speed of the circuit board while conveyor device 50 is being lowered. Determining section 212 is a functional unit for determining whether the circuit board being conveyed while the conveyor device 50 is being lowered may be loaded into working machine 192. Second calculating section 214 is a functional unit for calculating a timing for reducing the conveyance speed of the circuit board such that the circuit board conveyed while the conveyor device 50 is being lowered is not loaded into working machine 192. Third calculating section 216 is a functional unit for calculating the conveyance speed when the circuit board is loaded into solder printer 10.

Note that, solder printer 10 is an example of a substrate working machine. Control device 28 is an example of a control device. Conveyor device 50 is an example of a conveyance device. Board holding device 52 is an example of a holding device. Board raising and lowering device 54 is an example of a raising and lowering device. Conveyor belts 66 and 68 are examples of a conveyance belt. Stopper 124 is an example of a stopper. Camera moving device 120 is an example of a moving device. Work machine 190 is an example of an upstream side device. Work machine 192 is an example of a downstream side device. Determining section 212 is an example of a determining section.

Figure 15:
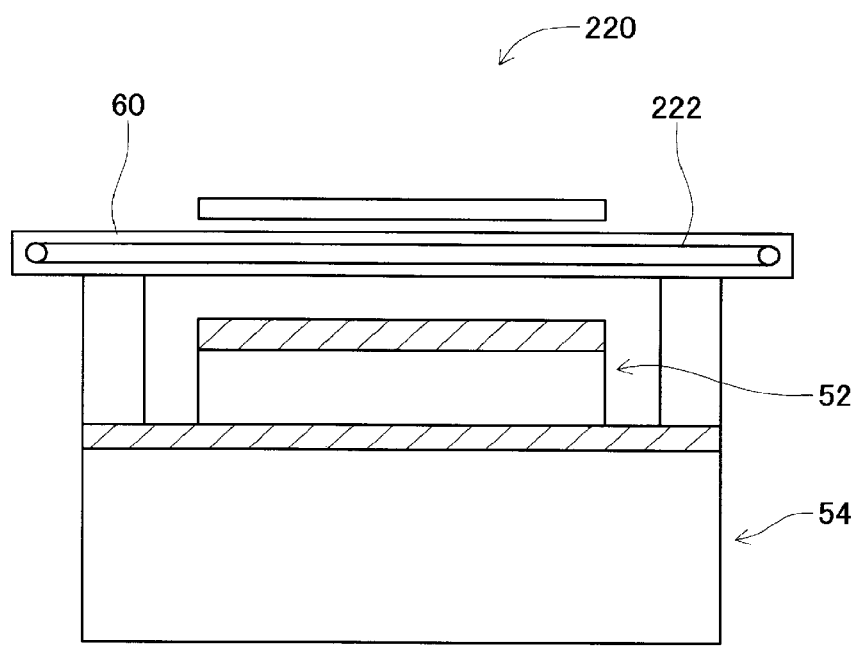
FIG. 15 is a side view showing a board conveying and holding device of an alternative embodiment.

Further, the present disclosure is not limited to the above example embodiments, and various changed or improved methods of embodiment are possible based on the knowledge of someone skilled in the art. Specifically, for example, in an embodiment above, board conveying and holding device 20 is employed in solder printer 10, but a device with a difference construction to board conveying and holding device 20, for example, board conveying and holding device 220 shown in FIG. 15, may be employed. With board conveying and holding device 220, unlike board conveying and holding device 20, two conveyor belts of first conveyor belts 66 and second conveyor belts 68 are not arranged on the respective guide rails 60 and 62, only one conveyor belt, conveyor belt 222, is arranged. The components of board conveying and holding device 220 are the same as those of board conveying and holding device 20 except for conveyor belt 222. Therefore, descriptions of the same components as those of board conveying and holding device 20 are omitted, and the same reference numerals are used.

Figure 16:
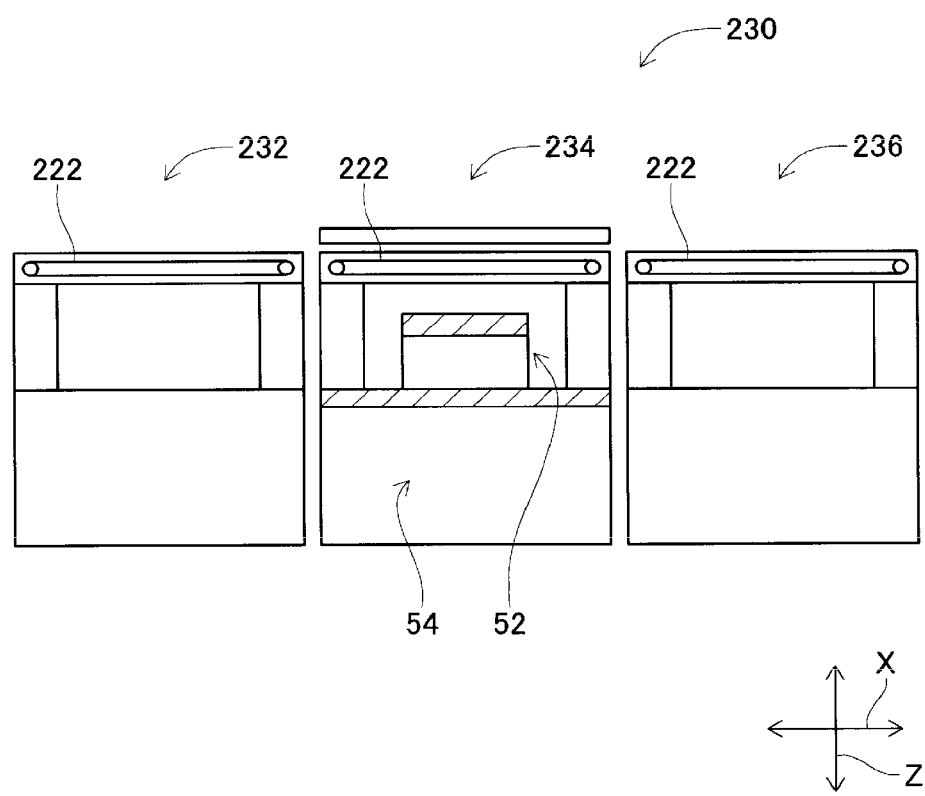
FIG. 16 is a side view showing a board conveying and holding device of an alternative embodiment.

Board conveying and holding device 230 shown in FIG. 16 may also be employed. Board conveying and holding device 230 is composed of three conveyance devices, 232, 234, and 236, and the three conveyance devices 232, 234, and 236 are lined up side by side in the X-direction. Conveyance device 234 is the same as board conveying and holding device 220 except for its dimensions. Therefore, descriptions of conveyance device 234 are omitted, and the same reference numerals as those of board conveying and holding device 220 are used for the same components. Conveyance device 232 and conveyance device 236 have the same structure as each other, and are configured as conveyance device 234 from which board holding device 52 and board raising and lowering device 54 have been removed. Therefore, descriptions of conveyance device 232 and conveyance device 236 are omitted, and the same reference numerals as those of conveyance device 234 are used for the same components. With board conveying and holding device 230, conveyance device 234 functions as a substrate working machine of the present disclosure. Conveyance device 232 functions as an upstream side device, and conveyance device 236 functions as a downstream side device.

Further, in an embodiment above, the conveyance speed of circuit board 80 and the like are calculated in controller 180 of solder printer 10, but the conveyance speed and the like may be calculated in an external device. The conveyance speed and the like calculated by the external device may be input to solder printer 10, and the solder printer 10 may control operation of board conveying and holding device 20 in accordance with the input conveyance speed and the like.

Further, in an embodiment above, solder printer 10 is employed as the substrate working machine, but various working machines can be employed as long as they are substrate working machines. Specifically, for example, a component mounter, an inspection machine, or the like may be employed.

REFERENCE SIGNS LIST

10: solder printer (substrate working machine);
28: control device;
50: conveyor device (conveyance device);
52: board holding device (holding device);
54: board raising and lowering device (raising and lowering device);
66: first conveyor belt (conveyance belt);
68: second conveyor belt (conveyance belt);
120: camera moving device (moving device);
124: stopper;
190: working machine (upstream device);
192: working machine (downstream device)
212: determining section

The invention claimed is:

1. A substrate working machine comprising:
a conveyance device configured to convey a substrate;
a holding device configured to hold the substrate conveyed to a work position by the conveyance device;
a raising and lowering device configured to integrally raise the conveyance device and the holding device in a state with the substrate held, and to integrally lower the conveyance device and the holding device in a state with the substrate released; and
a control device configured to control operation of the conveyance device and the raising and lowering device, wherein
the control device is configured to control the operation of the conveyance device such that the substrate is conveyed while the raising and lowering device lowers the substrate at a conveyance speed calculated based on a setting time which is set based on a time required for the raising and lowering device to integrally lower the holding device and the conveyance device and a conveyance distance of the substrate from the work position by the conveyance device or a conveyance distance of the substrate to the work position by the conveyance device.

2. The substrate working machine according to claim 1, wherein
the control device is configured to control the operation of the conveyance device such that the substrate is conveyed at the conveyance speed calculated based on the setting time, and the conveyance distance of the substrate by the conveyance device from the work position to a downstream end section, when the holding device and the conveyance device are integrally lowered by the raising and lowering device.

3. The substrate working machine according to claim 2, wherein
a downstream side device into which the substrate, which is unloaded from substrate working machine by conveyance by the conveyance device, is loaded, and the control device includes a determining section configured to determine whether the substrate can be loaded to the downstream side device, and is configured to control operation of the conveyance device such that, when the determining section determines that the substrate can be loaded to the downstream side device, the substrate is loaded to the downstream side device at the conveyance speed, and, when the determining section determines that the substrate cannot be loaded to the downstream side device, after the substrate is conveyed at the conveyance speed, the substrate is slowed at a specified time and stopped before being loaded to the downstream side device.

4. The substrate working machine according to claim 3, wherein
the conveyance device is configured to convey the substrate by rotation of a conveyance belt, and
the specified time is determined based on information related to at least one of the substrate and the conveyance belt.

5. The substrate working machine according to claim 1, wherein
an upstream side device is arranged on an upstream side of the substrate working machine, the substrate conveyed from the upstream side device is loaded to the substrate working machine, and the loaded substrate is conveyed by the conveyance device, and
the control device is configured to control operation of the conveyance device such that the substrate is conveyed at the conveyance speed calculated based on the setting time and the conveyance distance of the substrate by the conveyance device to the work position from the substrate being loaded to the substrate working machine from the upstream side device.

6. The substrate working machine according to claim 5, further comprising:

a moving device configured to move a stopper, which is used to stop the substrate conveyed by the conveyance device, to a given position, and the setting time is set based on a time required for the moving device to move the stopper to a position at which the substrate can be stopped at the work position.

\* \* \* \* \*